(12) United States Patent
Chen et al.

(10) Patent No.: US 10,141,233 B2
(45) Date of Patent: Nov. 27, 2018

(54) ELECTRONIC PACKAGE AND FABRICATION METHOD THEREOF

(71) Applicant: Siliconware Precision Industries Co., Ltd., Taichung (TW)

(72) Inventors: Lu-Yi Chen, Taichung (TW);
Chang-Lun Lu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/008,097

(22) Filed: Jan. 27, 2016

(65) Prior Publication Data
US 2017/0005023 A1 Jan. 5, 2017

(30) Foreign Application Priority Data
Jul. 3, 2015 (TW) .............................. 104121622 A (51) Int. Cl.
*H01L 23/34* (2006.01)
*H01L 21/66* (2006.01)
*H01L 21/56* (2006.01)
*H01L 23/31* (2006.01)

(52) U.S. Cl.
CPC ............ *H01L 22/14* (2013.01); *H01L 21/561* (2013.01); *H01L 21/568* (2013.01); *H01L 23/3121* (2013.01); *H01L 2224/16225* (2013.01); *H01L 2224/32225* (2013.01); *H01L 2224/73204* (2013.01); *H01L 2924/15174* (2013.01); *H01L 2924/15311* (2013.01); *H01L 2924/19105* (2013.01); *H01L 2924/19107* (2013.01)

(58) Field of Classification Search
CPC ..... H01L 2224/73265; H01L 2924/181; H01L 2924/15311; H01L 2224/32145; H01L 22/14; H01L 21/561; H01L 23/3221; H01L 23/14; H01L 23/49811; H01L 23/49822; H01L 23/49833; H01L 23/538; H01L 23/5385; H01L 25/44; H01L 23/5386; H01L 2924/14; H05K 2201/041; H05K 2201/043
USPC ................................................. 257/686, 723
See application file for complete search history.

(56) References Cited

U.S. PATENT DOCUMENTS

| | | | |
|---|---|---|---|
| 7,242,081 B1* | 7/2007 | Lee | H01L 25/0657 257/686 |
| 2006/0220210 A1* | 10/2006 | Karnezos | H01L 23/3135 257/686 |
| 2011/0285007 A1* | 11/2011 | Chi | H01L 24/96 257/686 |

* cited by examiner

*Primary Examiner* — Marc Armand
*Assistant Examiner* — Sarah Salerno
(74) *Attorney, Agent, or Firm* — Mintz Levin Cohn Ferris Glovsky and Popeo, P.C.; Peter F. Corless; Steven M. Jensen (57) ABSTRACT

An electronic package is provided, which includes: a first circuit structure; a plurality of first electronic elements disposed on a surface of the first circuit structure; at least a first conductive element formed on the surface of the first circuit structure; and a first encapsulant formed on the surface of the first circuit structure and encapsulating the first electronic elements and the first conductive element, with a portion of the first conductive element exposed from the first encapsulant. By directly disposing the electronic elements having high I/O functionality on the circuit structure, the present disclosure eliminates the need of a packaging substrate having a core layer, thereby reducing the thickness of the electronic package. The present disclosure further provides a method for fabricating the electronic package.

9 Claims, 7 Drawing Sheets

ELECTRONIC PACKAGE AND FABRICATION METHOD THEREOF

CROSS-REFERENCE TO RELATED APPLICATION

This application claims under 35 U.S.C. § 119(a) the benefit of Taiwanese Patent Application No. 104121622 filed Jul. 3, 2015, the entire contents of which are incorporated herein by reference.

BACKGROUND

1. Technical Field

The present disclosure relates to electronic packages, and more particularly, to an electronic package having a reduced size and a fabrication method thereof.

2. Description of Related Art

Along with the rapid development of electronic industries, electronic products are developed toward the trend of multi-function and high performance. Accordingly, there have been developed various types of flip-chip packaging modules such as chip scale packages (CSPs), direct chip attached (DCA) packages and multi-chip modules (MCM), and 3D IC chip stacking technologies.

Figure 1:
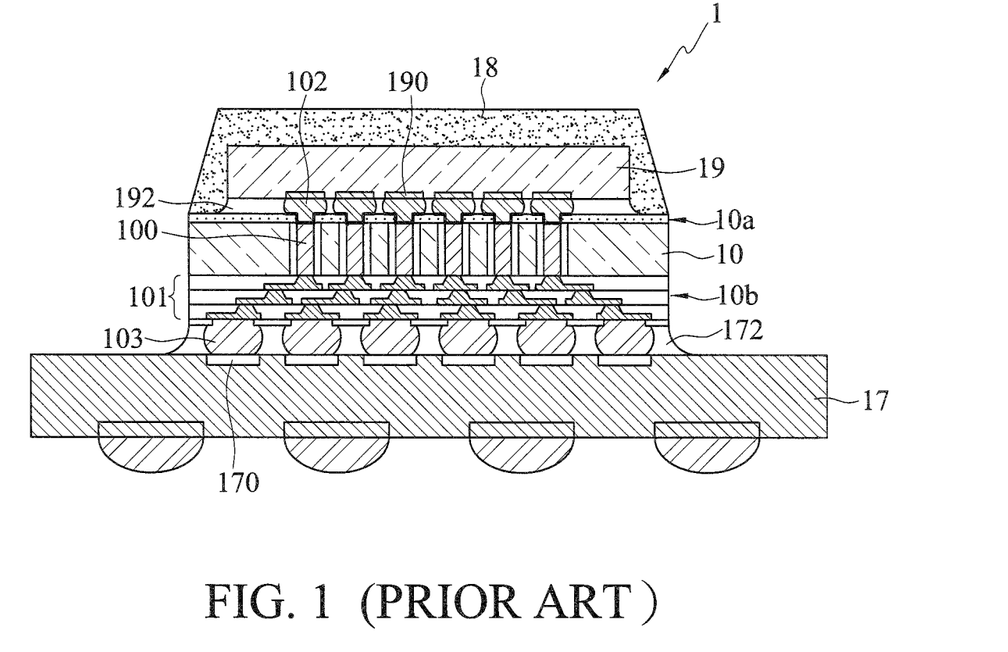
FIG. 1 is a schematic cross-sectional view of a conventional semiconductor package.

FIG. 1 is a schematic cross-sectional view of a conventional 3D chip stacking-type semiconductor package 1. Referring to FIG. 1, a silicon interposer 10 is provided. The silicon interposer 1 has a chip mounting side 10a, an external connection side 10b opposite to the chip mounting side 10a and having a plurality of redistribution layers 101 formed thereon, and a plurality of through silicon vias (TSVs) 100 communicating the chip mounting side 10a and the external connection side 10b. A semiconductor chip 19 having a plurality of electrode pads 190 is disposed on the chip mounting side 10a of the silicon interposer 10 and the electrode pads 190 are electrically connected to the chip mounting side 10a of the silicon interposer 10 through a plurality of solder bumps 102. The electrode pads 190 have a small pitch therebetween. Further, an underfill 192 is formed between the semiconductor chip 19 and the chip mounting side 10a of the silicon interposer 10 for encapsulating the solder bumps 102. Furthermore, an encapsulant 18 is formed on the silicon interposer 10 to encapsulate the semiconductor chip 19. In addition, a packaging substrate 17 having a plurality of bonding pads 170 is disposed on the external connection side 10b of the silicon interposer 10 and the bonding pads 170 are electrically connected to the redistribution layers 101 through a plurality of conductive elements 103 such as bumps. The bonding pads 170 of the packaging substrate 17 have a large pitch therebetween. Also, an underfill 172 is formed to encapsulate the conductive elements 103.

To fabricate the semiconductor package 1, the semiconductor chip 19 is disposed on the silicon interposer 10 first and then the silicon interposer 10 having the semiconductor chip 19 is disposed on the packaging substrate 17 through the conductive elements 103. Subsequently, the encapsulant 18 is formed, thereby obtaining the semiconductor packager 1.

However, in the conventional semiconductor package 1, the silicon interposer 10 serves as a signal transmission medium between the semiconductor chip 19 and the packaging substrate 17. To achieve a suitable silicon interposer 10, the TSVs 100 must be controlled to have a certain depth to width ratio (100 um/10 um), thus consuming a large amount of time and chemical agent and incurring a high fabrication cost.

Further, the packaging substrate 17 has a core layer containing glass fiber. Consequently, the packaging substrate 17 is quite thick, which hinders miniaturization of the semiconductor package 1.

Furthermore, when the semiconductor chip 19 has features of fine trace width, fine pitch and high I/O count, the area of the silicon interposer 10 and the area of the corresponding packaging substrate 17 must be increased, thereby hindering miniaturization of the semiconductor package 1.

Therefore, how to overcome the above-described drawbacks has become critical.

SUMMARY

In view of the above-described drawbacks, the present disclosure provides an electronic package, which comprises: a first circuit structure having a first surface and a second surface opposite to the first surface; a plurality of first electronic elements disposed on the first surface of the first circuit structure; at least a first conductive element disposed on the first surface of the first circuit structure; and a first encapsulant formed on the first surface of the first circuit structure and encapsulating the first electronic elements and the first conductive element, wherein a portion of the first conductive element is exposed from the first encapsulant.

The present disclosure further provides a method for fabricating an electronic package, which comprises: providing a first circuit structure having opposite first and second surfaces; disposing a plurality of first electronic elements on the first surface of the first circuit structure; disposing at least a first conductive element on the first surface of the first circuit structure; and forming a first encapsulant on the first surface of the first circuit structure to encapsulate the first electronic elements and the first conductive element, wherein a portion of the first conductive element is exposed from the first encapsulant.

In the above-described package and method, a first metal layer can further be formed on the first encapsulant. For example, the first metal layer is in contact with the first conductive element.

In one embodiment, the method of the present disclosure can further comprise: forming a second circuit structure on the second surface of the first circuit structure; disposing a plurality of second electronic elements on the second circuit structure; disposing at least a second conductive element on the second circuit structure; and forming a second encapsulant on the second circuit structure to encapsulate the second electronic elements and the second conductive element, wherein the a portion of the second conductive element is exposed from the second encapsulant. In one embodiment, a second metal layer can be formed on the second encapsulant and in contact with the second conductive element. Furthermore, a conductor wall can be formed on the second circuit structure and encapsulated by the second encapsulant. A portion of the conductor wall can be exposed from the second encapsulant. In addition, a portion of the second circuit structure can be exposed from the second encapsulant. Further, an electrical test can be performed on the first electronic elements, the first conductive element, the first circuit structure and the second circuit structure.

In one embodiment, a conductor wall can be formed on the first surface of the first circuit structure and encapsulated by the first encapsulant. A portion of the conductor wall can be exposed from the first encapsulant.

In one embodiment, a portion of the first circuit structure can be exposed from the first encapsulant.

Therefore, by directly disposing the first electronic elements having high I/O functionality on the first circuit structure, the present disclosure eliminates the need of a packaging substrate having a core layer so as to reduce the thickness of the electronic package.

Further, the first and second circuit structures of the electronic package allow a plurality of electronic elements to be disposed on two opposite sides of the electronic package, thereby reducing the area of the electronic package.

BRIEF DESCRIPTION OF DRAWINGS

FIG. 4' is schematic upper view of FIG. 4.

DETAILED DESCRIPTION OF PREFERRED EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a," etc. are merely for illustrative purposes and should not be construed to limit the scope of the present disclosure.

FIGS. 2A to 2H are schematic cross-sectional views showing a method for fabricating an electronic package 2 according to a first embodiment of the present disclosure.

Figure 2A:
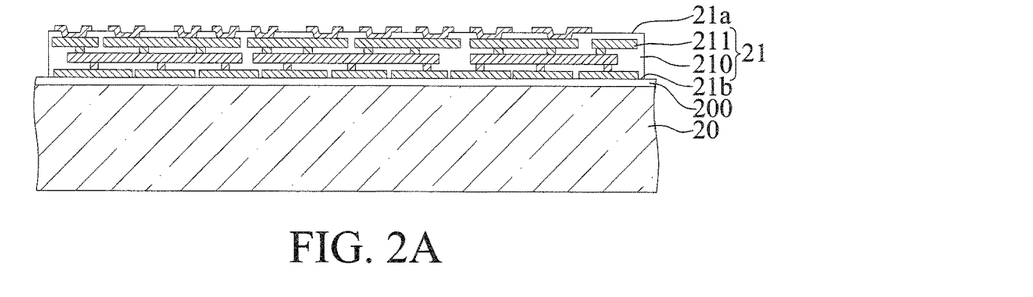
FIGS. 2A to 2H are schematic cross-sectional views showing a method for fabricating an electronic package according to a first embodiment of the present disclosure, wherein FIG. 2G' is a schematic upper view of FIG. 2G, and FIG. 2H' is a schematic lower view of FIG. 2H.

Referring to FIG. 2A, a carrier 20 having a first circuit structure 21 is provided.

The carrier 20 is a semiconductor substrate made of, for example, a silicon wafer or glass. The carrier 20 has a bonding layer 200 bonded to the first circuit structure 21. The bonding layer 200 is a thermal $SiO_2$ layer, a release layer or a protection layer. In the present embodiment, the carrier 20 is a silicon wafer and the bonding layer 200 is a thermal $SiO_2$ layer.

The first circuit structure 21 has a first surface 21a and a second surface 21b opposite to the first surface 21a. The first circuit structure 21 is bonded to the bonding layer 200 via the second surface 21b thereof. The first circuit structure 21 further has at least a dielectric layer 210 and a redistribution layer 211 formed on the dielectric layer 210.

Figure 2B:
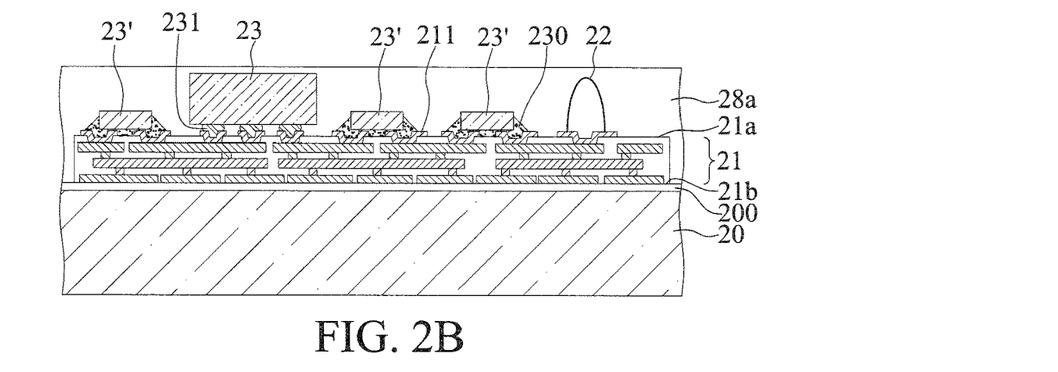

Referring to FIG. 2B, a plurality of first electronic elements 23, 23' are disposed on the first surface 21a of the first circuit structure 21, and at least a first conductive element 22 is formed on the first surface 21a of the first circuit structure 21. Then, a first encapsulant 28a is formed on the bonding layer 200 and the first surface 21a of the first circuit structure 21 to encapsulate the first electronic elements 23, 23' and the first conductive element 22.

In the present embodiment, each of the first electronic elements 23, 23' is an active element such as a semiconductor chip, a passive element such as a resistor, a capacitor or an inductor, or a combination thereof.

The first electronic elements 23, 23' are electrically connected to the first circuit structure 21 in a flip-chip manner. In particular, each of the first electronic elements 23 is electrically connected to the redistribution layer 211 of the first circuit structure 21 through a plurality of solder bumps 231, and each of the first electronic elements 23' is bonded to the first surface 21a of the first circuit structure 21 through a bonding material 230 such as an underfill. Alternatively, the first electronic elements 23, 23' can be electrically connected to the first circuit structure 21 through wire bonding.

The first conductive element 22 is a bonding wire formed through wire bonding and has a loop shape. Alternatively, the first conductive element 22 can be a conductive post.

The first encapsulant 28a is made of polyimide, a dry film, an epoxy resin or a molding compound.

Figure 2C:
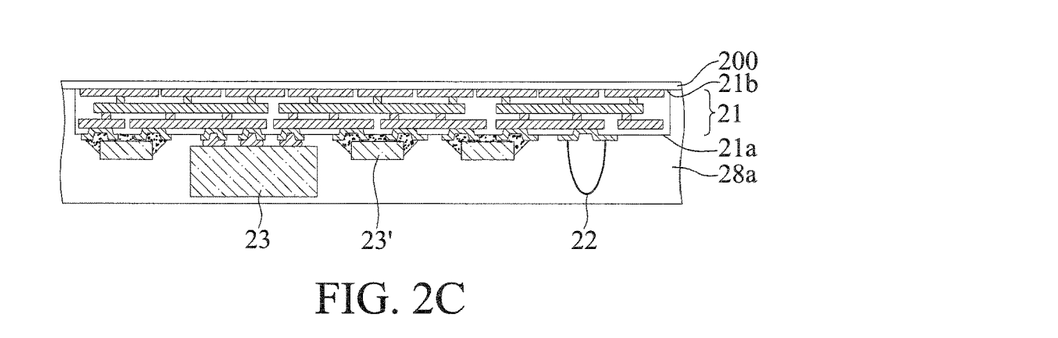

Referring to FIG. 2C, a large portion of the carrier 20 is first removed by grinding and then the remaining portion of the carrier 20 is removed. But the bonding layer 200 is left and not removed.

In the present embodiment, the bonding layer 200 serves as an etch stop layer and the remaining portion of the carrier 20 is removed by etching.

Figure 2D:
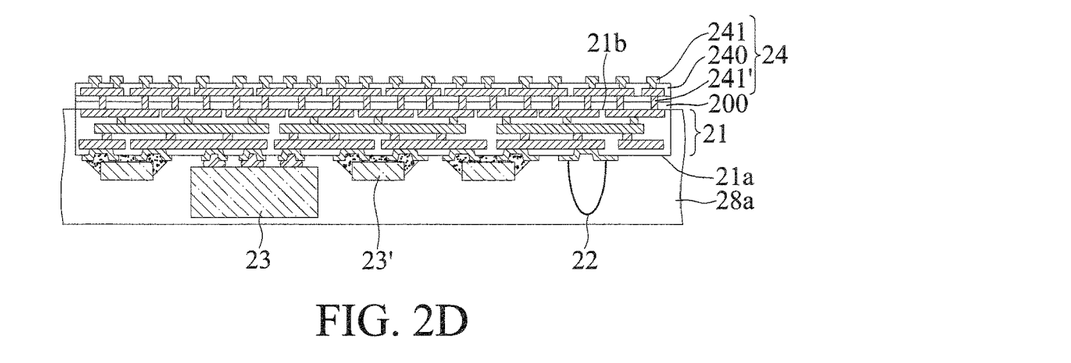

Referring to FIG. 2D, a second circuit structure 24 is formed on the second surface 21b of the first circuit structure 21. Then, an electrical test is performed on the first electronic elements 23, 23', the first conductive element 22, and the first and second circuit structures 21, 24.

In the present embodiment, the second circuit structure 24 has at least a dielectric layer 240 and a redistribution layer 241 formed on the dielectric layer 240.

A portion of the redistribution layer 241' extends into the bonding layer 200. In particular, the dielectric layer 240 is formed on the bonding layer 200 first, and then a plurality of via holes are formed in the dielectric layer 240 and the bonding layer 200, and thereafter, the redistribution layer 241' is formed on the dielectric layer 240 and in the via holes.

Further, a circuit test can be performed after mounting of the low-cost first electronic elements 23, 23' (chips and passive elements). After the first and second circuit structures 21, 24 are determined to function properly, KGDs (Known good dies) i.e., a plurality of second electronic elements 25, 25', can be disposed, which will be described later. Therefore, the yield of the final package is improved.

Figure 2E:
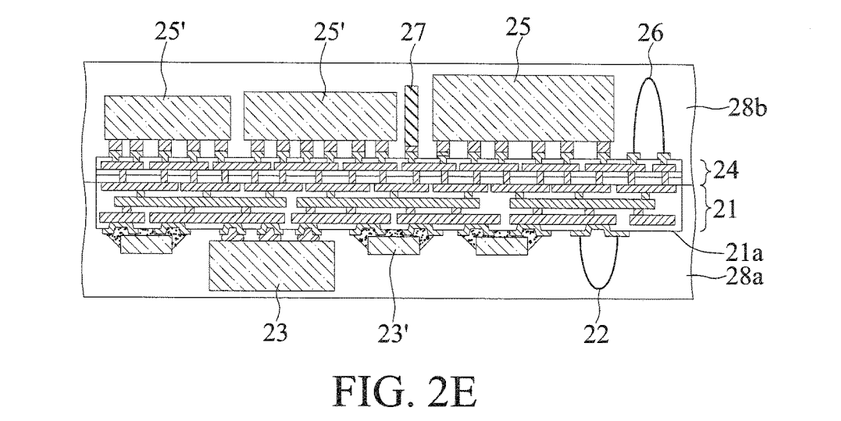

Referring to FIG. 2E, at least a second conductive element 26 is formed on the second circuit structure 24 and then a plurality of second electronic elements 25, 25' are disposed on the second circuit structure 24. Thereafter, a second encapsulant 28b is formed on the second circuit structure 24 to encapsulate the second electronic elements 25, 25' and the second conductive element 26.

In the present embodiment, each of the second electronic elements 25, 25' is an active element such as a semiconductor chip, a passive element such as a resistor, a capacitor or an inductor, or a combination thereof. For example, the second electronic elements 25, 25' are electrically connected to the second circuit structure 24 in a flip-chip manner.

Alternatively, the second electronic elements 25, 25' can be electrically connected to the second circuit structure 24 through wire bonding.

The second conductive element 26 is a bonding wire formed through wire bonding and has a loop shape. Alternatively, the second conductive element 26 can be a conductive post.

The second encapsulant 28b is made of a material that is the same as or different from the first encapsulant 28b. The second encapsulant 28b is made of polyimide, a dry film, an epoxy resin or a molding compound.

Before disposing of the second electronic elements 25, 25', at least a conductor wall 27 made of such as a metal material is further formed on the second circuit structure 24. The conductor wall 27 is also encapsulated by the second encapsulant 28b.

Figure 2F:
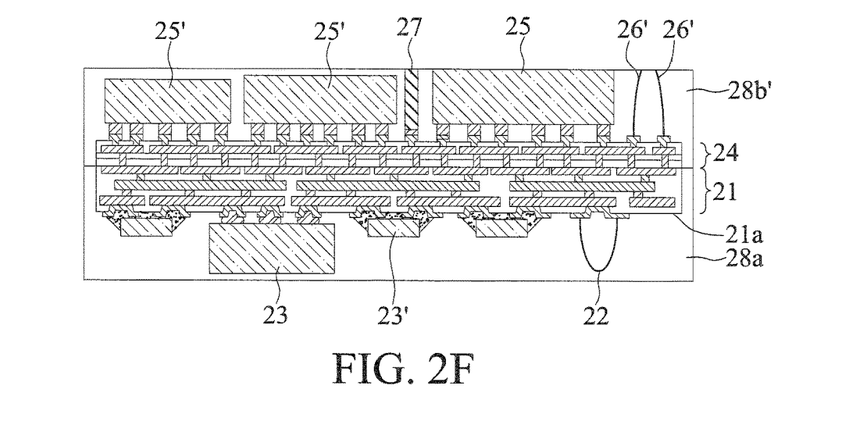

Referring to FIG. 2F, the second encapsulant 28b is planarized to form a planarized second encapsulant 28b', which exposes portions of surfaces of the second electronic elements 25 and an end surface of the conductor wall 27.

In the present embodiment, a grinding process is performed to remove a portion of the second encapsulant 28b as well as portions of the second electronic elements 25 and the conductor wall 27.

Further, when the second encapsulant 28b is partially removed, the second conductive element 26 is also partially removed to form two separated segments 26'. Each of the segments 26' has an end surface exposed from the second encapsulant 28b'.

Figure 2G:
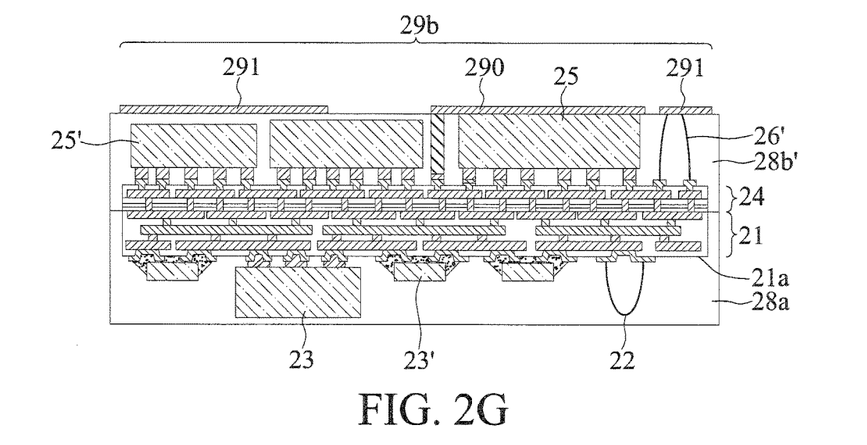

Referring to FIG. 2G, a second metal layer 29b is formed on the second encapsulant 28b' and in contact with portions of the surfaces of the second electronic elements 25, the conductor wall 27 and the second conductive elements 26'.

In the present embodiment, the second metal layer 29b is a patterned circuit layer having a panel portion 290 and an antenna portion 291, as shown in FIG. 2G'. In particular, the panel portion 290 is in contact with the second electronic elements 25 and the conductor wall 27 for heat dissipation and shielding, and the antenna portion 291 is in contact with the second conductive elements 26'.

In the processes of FIGS. 2D to 2G, the first encapsulant 28a serves as carrier and hence no additional carrier is required.

Figure 2H:
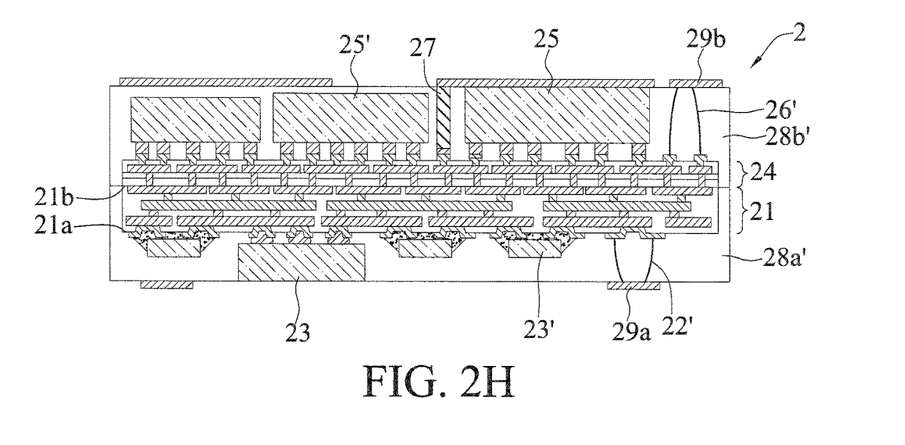

Referring to FIG. 2H, the first encapsulant 28a is planarized to form a planarized first encapsulant 28a', which exposes portions of surfaces of the first electronic elements 23. Further, a first metal layer 29a is formed on the first encapsulant 28a'.

In the present embodiment, when the first encapsulant 28a is partially removed, portions of the first electronic elements 23 are also removed.

Further, when the first encapsulant 28a is partially removed, the first conductive element 22 is also partially removed to form two separated segments 22'. Each of the segments 22' has an end surface exposed from the first encapsulant 28a'.

The first metal layer 29a is a patterned circuit layer having a plurality of conductive pads 292 and a plurality of electrical contacts 293, as shown in FIG. 2H'. The conductive pads 292 are in contact with the first conductive elements 22'.

FIGS. 3A to 3E are schematic cross-sectional views showing a method for fabricating the electronic package 2 according to a second embodiment of the present disclosure. The second embodiment differs from the first embodiment in that some processes are performed in a different order.

Figure 3A:
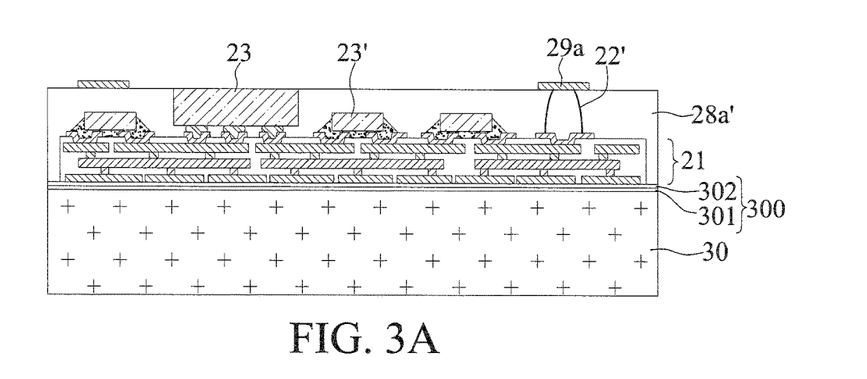
FIGS. 3A to 3E are schematic cross-sectional views showing a method for fabricating an electronic package according to a second embodiment of the present disclosure.

Referring to FIG. 3A, continued from FIG. 2B, the first encapsulant 28a is planarized to form a planarized first encapsulant 28', which exposes portions of the surfaces of the first electronic elements 23. Then, a first metal layer 29a is formed on the first encapsulant 28a'.

In the present embodiment, the detailed process of FIG. 3A can refer to the above-described process of FIG. 2H.

Further, the carrier 30 is glass, and the bonding layer 300 consists of a release layer 301 and a protection layer 302 laminated on the release layer 301. The protection layer 302 is made of polybenzoxazole (PBO).

In addition, a portion of the redistribution layer of the first circuit structure 21 can be formed in the protection layer 302 (not shown). For example, a plurality of via holes are first formed in the release layer 301 and the protection layer 302 and then the redistribution layer is formed on the protection layer 302 and in the via holes.

Figure 3B:
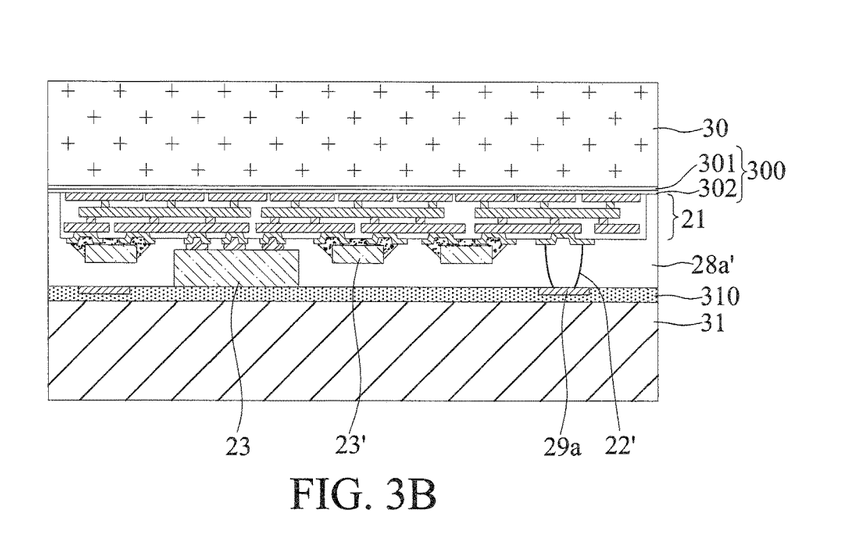

Referring to FIG. 3B, a carrier 31 is disposed on the first encapsulant 28a'.

In the present embodiment, the carrier 31 is bonded to the first encapsulant 28a' through an insulating layer 310, for example, an adhesive, and the first metal layer 29a is encapsulated by the insulating layer 310.

Figure 3C:
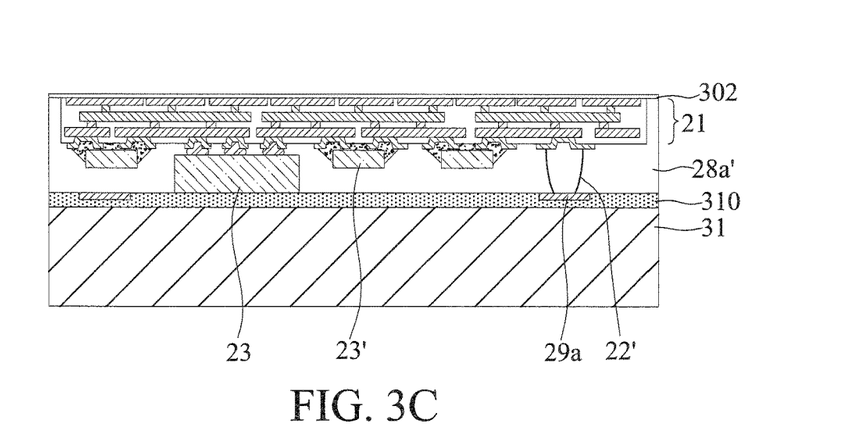

Referring to FIG. 3C, the carrier 30 is removed through the release layer 301, and only the protection layer 302 of the bonding layer 300 remains on the first circuit structure 21.

Figure 3D:
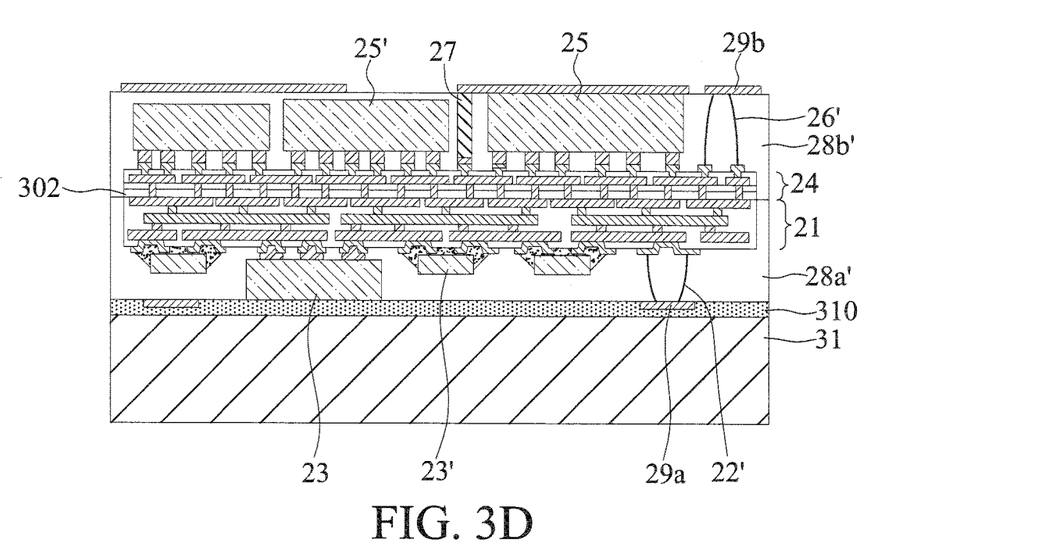

Referring to FIG. 3D, the processes of FIGS. 2D to 2G are performed.

Figure 3E:
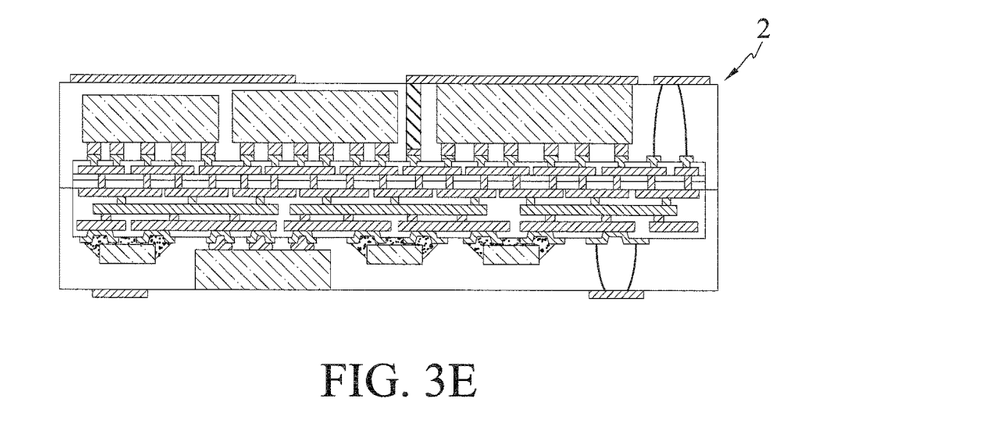

Referring to FIG. 3E, the carrier 31 and the insulating layer 310 are removed to form the electronic package 2 of FIG. 2H.

Figure 4:
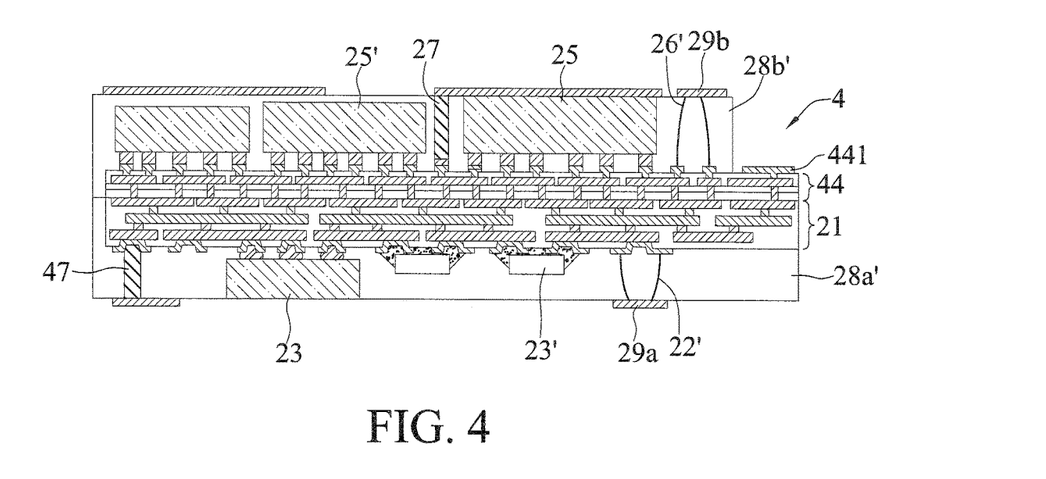
FIG. 4 is a schematic cross-sectional view of an electronic package according to another embodiment of the present disclosure.

FIGS. 4 and 4' are schematic views of an electronic package 4 according to another embodiment of the present disclosure.

Referring to FIG. 4, a portion of the second circuit structure 44 is not covered by the second encapsulant 28b'. In particular, a portion of the redistribution layer 441 is exposed from the second encapsulant 28b'.

In the present embodiment, the exposed portion of the redistribution layer 441 is traces. The traces serve as extended electrical contacts that allow the electronic package 4 to be directly electrically connected to an electronic device in a card-insertion manner.

Further, at least a conductor wall 47 made of such as a metal material can be formed on the first surface 21a of the first circuit structure 21 and encapsulated by the first encapsulant 28a'. An end surface of the conductor wall 47 is exposed from the first encapsulant 28a'.

In addition, a portion of the redistribution layer of the first circuit structure 21 can be exposed from the first encapsulant 28a' to serve as extended electrical contacts (not shown), thereby allowing the electronic package to be directly electrically connected to an electronic device in a card-insertion manner.

According to the present disclosure, a plurality of electronic elements (the first and second electronic elements 23, 23', 25, 25') having high I/O functionality are directly disposed on the first and second circuit structures 21, 24. Therefore, the present disclosure eliminates the need of a packaging substrate having a core layer so as to reduce the thickness of the electronic package 2, 4.

Further, since the first and second circuit structures 21, 24 of the electronic package 2, 4 allow the electronic elements (the first and second electronic elements 23, 23', 25, 25') to be disposed on the two opposite sides of the electronic package 2, 4, the area of the electronic package 2, 4 can be reduced.

The present disclosure further provides an electronic package 2, 4, which has: a first circuit structure 21 having a first surface 21a and a second surface 21b opposite to the first surface 21a; a plurality of first electronic elements 23, 23' disposed on the first surface 21a of the first circuit structure 21; at least a first conductive element 22' formed on the first surface 21a of the first circuit structure 21; and a first encapsulant 28a' formed on the first surface 21a of the first circuit structure 21 for encapsulating the first electronic elements 23, 23' and the first conductive element 22'. The first conductive element 22' is exposed from the first encapsulant 28a'.

The electronic package 2, 4 can further have a first metal layer 29a formed on the first encapsulant 28a' and in contact with the first conductive elements 22'.

The electronic package 2, 4 can further have a second circuit structure 24 formed on the second surface 21b of the first circuit structure 21; a plurality of second electronic elements 25, 25' disposed on the second circuit structure 24; at least a second conductive element 26' formed on the second circuit structure 24; and a second encapsulant 28b' formed on the second circuit structure 24 for encapsulating the second electronic elements 25, 25' and the second conductive element 26'. The second conductive element 26' is exposed from the second encapsulant 28b'.

The electronic package 2, 4 can further have a second metal layer 29b formed on the second encapsulant 28b' and in contact with the second conductive element 26'.

In an embodiment, the electronic package 2, 4 further has a conductor wall 27 formed on the second circuit structure 24 and encapsulated by the second encapsulant 28b'. Further, an end surface of the conductor wall 27 is exposed from the second encapsulant 28b'.

In an embodiment, the electronic package 4 further has a conductor wall 47 formed on the first surface 21a of the first circuit structure 21 and encapsulated by the first encapsulant 28a'. Further, an end surface of the conductor wall 47 is exposed from the first encapsulant 28a'.

In an embodiment, a portion of the second circuit structure 44 of the electronic package 4 is exposed from the second encapsulant 28b'.

Therefore, by directly disposing a plurality of electronic elements having high I/O functionality on the first and second circuit structures, the present disclosure eliminates the need of a packaging substrate having a core layer so as to reduce the thickness of the electronic package.

Further, since the first and second circuit structures of the electronic package allow the electronic elements to be disposed on the two opposite sides of the electronic package, the area of the electronic package can be reduced.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
   a first circuit structure having a first surface and a second surface opposite to the first surface, wherein the first circuit structure has at least a first redistribution layer;
   a plurality of first electronic elements disposed on and directly attached to the first surface of the first circuit structure;
   at least a first conductive element disposed on the first surface of the first circuit structure;
   a first encapsulant formed on the first surface of the first circuit structure and encapsulating the first electronic elements and the first conductive element, with a portion of the first conductive element exposed from the first encapsulant, wherein the first encapsulant is in direct contact with the first circuit structure and the first electronic elements;
   a first metal layer formed on the first encapsulant, wherein the first metal layer is a circuit layer and in direct contact with the first conductive element and the first encapsulant;
   a second circuit structure formed on and being in direct contact with the second surface of the first circuit structure, wherein the second circuit structure has at least a second redistribution layer;
   a plurality of second electronic elements bonded to the second circuit structure, wherein each of the second electronic elements is an active element, a passive element, or a combination thereof; and
   a second encapsulant formed on the second circuit structure and encapsulating the second electronic elements, wherein the second encapsulant is in direct contact with the second circuit structure and the second electronic elements.

2. The electronic package of claim 1, further comprising:
   at least a second conductive element disposed on the second circuit structure; and
   the second encapsulant encapsulating the second conductive element, with a portion of the second conductive element exposed from the second encapsulant.

3. The electronic package of claim 2, further comprising a second metal layer formed on the second encapsulant.

4. The electronic package of claim 3, wherein the second metal layer is in contact with the second conductive element.

5. The electronic package of claim 2, further comprising a conductor wall formed on at least one of the second circuit structure and the first surface of the first circuit structure.

6. The electronic package of claim 5, wherein the conductor wall formed on the second circuit structure is encapsulated by the second encapsulant, with a portion of the conductor wall on the second circuit structure exposed from the second encapsulant.

7. The electronic package of claim 5, wherein the conductor wall formed on the first surface of the first circuit structure is encapsulated by the first encapsulant, with a portion of the conductor wall on the first surface of the first circuit structure exposed from the first encapsulant.

8. The electronic package of claim 2, wherein a portion of the second circuit structure is exposed from the second encapsulant.

9. The electronic package of claim 1, wherein a portion of the first circuit structure is exposed from the first encapsulant.

* * * * *